United States Patent [19]

Gelston, II

[11] Patent Number: 4,613,812
[45] Date of Patent: Sep. 23, 1986

[54] MICROWAVE DETECTION SYSTEM

[75] Inventor: Norbert E. Gelston, II, Skaneateles, N.Y.

[73] Assignee: U.S. Tech Corporation, Syracuse, N.Y.

[21] Appl. No.: 683,160

[22] Filed: Dec. 18, 1984

Related U.S. Application Data

[63] Continuation-in-part of Ser. No. 579,680, Feb. 13, 1984, abandoned, which is a continuation-in-part of Ser. No. 446,333, Dec. 2, 1982, abandoned.

[51] Int. Cl.[4] .................... G01R 27/04; B23B 39/04
[52] U.S. Cl. ............................ 324/58.5 B; 408/11; 408/6
[58] Field of Search .......................... 408/6, 8, 11; 324/58.5 B, 58.5 C, 58.5 R

[56] References Cited

U.S. PATENT DOCUMENTS

| | | | |
|---|---|---|---|
| 3,753,086 | 8/1973 | Shoemaker | 324/58.5 B |
| 3,990,805 | 11/1976 | Ducrohet | 324/161 |
| 4,045,727 | 8/1977 | Yu | 324/58.5 B |
| 4,097,796 | 6/1978 | Lunden | 324/58.5 B |
| 4,166,973 | 9/1979 | Lilly | 324/58.5 B |

FOREIGN PATENT DOCUMENTS

| | | | |
|---|---|---|---|
| 2341948 | 3/1974 | Fed. Rep. of Germany | 324/58.5 B |
| 445925 | 10/1975 | U.S.S.R. | 324/58.5 B |

OTHER PUBLICATIONS

Summerhill; "Microwaves as an Industrial Tool"-Measurements & Instrument Review-Feb. 1969-pp. 79-81.

Primary Examiner—Reinhard J. Eisenzopf
Assistant Examiner—Jose M. Solis
Attorney, Agent, or Firm—Jacobs & Jacobs

[57] ABSTRACT

A microwave detection system is constructed which is useful for detecting the presence or absence of a target within a microwave transmission line.

17 Claims, 5 Drawing Figures

MICROWAVE DETECTION SYSTEM

This is a continuation-in-part of U.S. Ser. No. 579,680 filed Feb. 13, 1984 which is a continuation-in-part of U.S. Ser. No. 446,333 filed Dec. 2, 1982, both now abondoned.

The present invention relates generally to a microwave detection system and, in particular, to a microwave detection system that is capable of determining the continuity or discontinuity of a target at relatively close range.

Most detection systems used in industry to automatically determine the presence or the absence of a tool or a continuous workpiece such as a finely drawn filament or a thin coating do not have the sensitivity to accurately and repeatedly detect the condition of such tool or workpiece when the element is relatively small. For example, many holes that are presently being drilled in printed circuit boards are 0.013" or less in diameter. The boards are usually manufactured in highly automated machines capable of carrying out a number of drilling operations at one time. A machine operator normally will be responsible for loading and unloading stacks of boards into and out of a number of machines. Accordingly, he cannot visually inspect the drilling tools with any degree of accuracy or consistency. Failure to detect a broken tool can thus lead to the production of a large number of defective pieces that must be either scrapped or reworked at added expense.

SUMMARY OF THE INVENTION

The present invention provides a microwave detection system which is capable of determining the continuity or discontinuity of a target within the microwave system. Such targets include tools, wires, surface discontinuities, sizes, and volume capacities. The microwave detection system of the present invention is particularly useful for detecting the presence or absence of a target at relatively close range. This ability is particularly useful for detecting the presence of a particular tool or portion thereof in an automated machine, thereby providing the capability to detect breakage of such a tool during the course of an automated operation.

The microwave detection system of the present invention can be readily constructed and retrofitted to an existing machine or added to the structure of a newly produced machine.

The detection system of the present invention provides a broad sensitivity range which constitutes an improvement both as to sensitivity and breadth compared to those devices heretofore known in the art.

The microwave detection system of the present invention is particularly useful because it is relatively insensitive to outside noise, debris and abrasion which frequently interfere with detection systems heretofore known in the art.

According to one embodiment of the present invention, the microwave detection system comprises a microwave transmission line having an opening within which the target is situated, for transmitting a microwave signal down the transmission line toward the target and for receiving a reflected return wave signal traveling the opposite direction, positioned at one end of the transmission line, a transmitter/receiver means connected to said system transmitting and receiving signals to provide an output signal having a component which indicates the presence or absence of the target within the transmission line opening and processing means coupled directly to the output of the transmitter/receiver means for comparing the component to a predetermined level to determine the presence or absence of the target. The position of the transmission line opening relative to the transmitting and receiving means is selected to optimize the signal strength from the transmitter/receiver means.

According to another embodiment of the present invention, the microwave detection system comprises a waveguide as the microwave transmission line having an opening therein in which the target such as a drill bit, wire, or the like is positioned so that it is within the waveguide opening. The means for transmitting the microwave signal down the waveguide toward the target and for receiving reflected return wave signals may be a transceiver module connected to the waveguide at one end thereof. The transmitter/receiver means transmits and receives signals so that the amplitude and phase shift changes produced by the presence of the target are readily discernible.

According to another embodiment, the transmitter/receiver means transmits and receives signals where the amplitude and phase shift changes produced by the presence of the target are readily discernible as a D.C. output signal component. A comparator may be directly coupled to the transmitter/receiver means in order to senses the D.C. component and produce an output which indicates either the presence or absence of the target within the transmission line or waveguide.

According to a further embodiment of the present invention, a shorting stub is disposed within the microwave transmission line behind the target in order to tune the system for optimum detection of the presence or absence of the target. Preferably, the system is tuned for each target.

The microwave detection system of the present invention is particularly useful for detecting the breaking of a portion of the target, such as, for example, the breaking of a portion of a drill bit.

According to a further embodiment of the present invention, a shorting stub is positioned a distance $N \lambda/4$ or $N \lambda/8$ from the waveguide opening wherein N is any integer and $\lambda$ is the wavelength of the transmitted signal.

According to a further embodiment of the present invention, the transmitter/receiver means comprises a Gunn diode and a Schottky diode.

According to a further embodiment of the present invention, an amplifier is operatively positioned between the transmitter/receiver means and comparison means for amplifying the output signal.

According to a further embodiment of the present invention, the transmission line opening is located a distance $N \lambda/4$ or $N \lambda/8$ from the transmitter or receiver means where N is any integer and $\lambda$ is the wavelength of the transmitted signal.

According to a further embodiment of the present invention, the transmission line is a waveguide having an opening centered in the waveguide and a shorting stub is positioned in the waveguide behind the target.

According to a further embodiment of the present invention, the shorting stub is positioned relative to the waveguide opening to optimize the signal strength from the transmitter/receiver means.

According to a further embodiment of the present invention, the waveguide opening is 0.5" or less.

The present invention also includes a method of detecting the presence or absence of a target within the microwave transmission line of the microwave detection system of the present invention which comprises positioning the target within the opening in the transmission line, transmitting a microwave signal down the transmission line toward the target, receiving a return wave signal reflected back along the transmission line in the opposite direction from the target to the transmitter/receiver means to provide an output signal having a component indicative of the presence or absence of the target within the opening, and comparing the component of the signal to a given value to determine the presence or absence of the target. The position of the transmission line opening relative to the transmitter/receiver means is selected to optimize the signal strength from the transmitter/receiver means.

The method of the present invention may include the further step of positioning a shorting stub with the transmission line behind the target.

According to a further embodiment of the method of the present invention, the stub is positioned a distance of $N \lambda/4$ or $N \lambda/8$ from the target where N is a positive integer and $\lambda$ is the wavelength of the transmitted signal.

According to a further embodiment of the method of the present invention, the transmission line opening is located a distance of $N \lambda/4$ or $N \lambda/8$ from the transmitter/receiver means where N is a positive integer and $\lambda$ is the wavelength of the transmitted signal.

According to a further embodiment of the method of the present invention, there may be a further step of amplifying the transmitter/receiver means signal.

According to a further embodiment of the method of the present invention, the transmission line is a waveguide having an opening centered in the waveguide and a shorting stub is positioned in the waveguide behind the target.

According to a further embodiment of the method of the present invention, the shorting stub is positioned relative to the waveguide opening to optimize the signal strength from the transmitter/receiver means.

Figures 1, 3, 4:
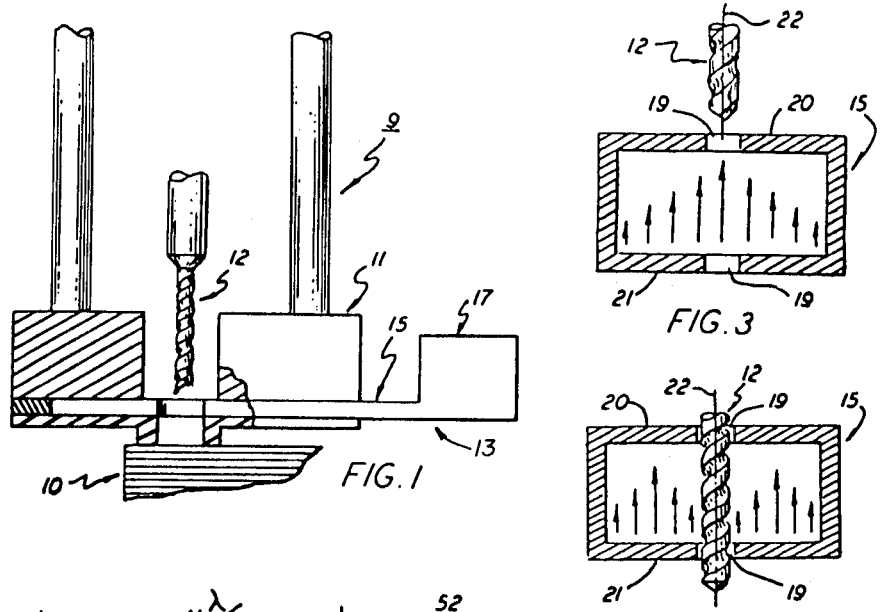
FIG. 1 is a partial side view of a machine tool fitted with the present invention.
FIG. 3 is a section through the waveguide of the broken tool detecting system shown in FIG. 2 illustrating the E-field intensity in the waveguide when the target is removed therefrom.
FIG. 4 is also a section through the waveguide illustrating the E-field intensity in the waveguide when the target is present.

The microwave detection system according to the present invention is suitable for detecting a wide variety of targets, but is particularly useful for detecting relatively small targets such as drill bits at relatively close range. Thus the microwave detection system according to the present invention is particularly useful in combination with an automatic drilling machine wherein a number of drilling operations are being conducted simultaneously as the microwave detection system according to the present invention is capable of detecting the presence or absence of a plurality of targets. With reference to the Figures, automated drilling machine 9 is utilized to drill extremely small holes in a stack of printed circuit boards 10. The machine includes at least one pressure foot assembly 11 in each drilling station that houses a retractable drill 12. While the present invention is particularly useful for drill targets having a diameter that is at or below 0.013" it is also useful for larger size targets and planar surfaces as well.

The microwave detection system of the present invention is shown as 13 retrofitted to the pressure foot assembly of the machine. Since the system does not require physical contact, it can be mounted in any convenient location to detect the continuity or the discontinuity of the target. The detection system includes a waveguide 15 and a transceiver module 17. The waveguide passes through the work zone of the drilling station and is terminated by an adjustable shorting stub 18 of the type that is well known and used in the art. The waveguide shown is rectangular in cross-sectional form and contains two small coaligned holes 19—19 centered in the top broadwall 20 and the bottom broadwall 21 of the waveguide. Normally, the elongated shank of the drill 12 is contained in the holes and sufficient clearance is provided therebetween to enable the drill to move vertically towards and away from the work. The drill in FIG. 1 is shown in a broken condition although in operation the drill would be within the waveguide for detection.

Figure 2:
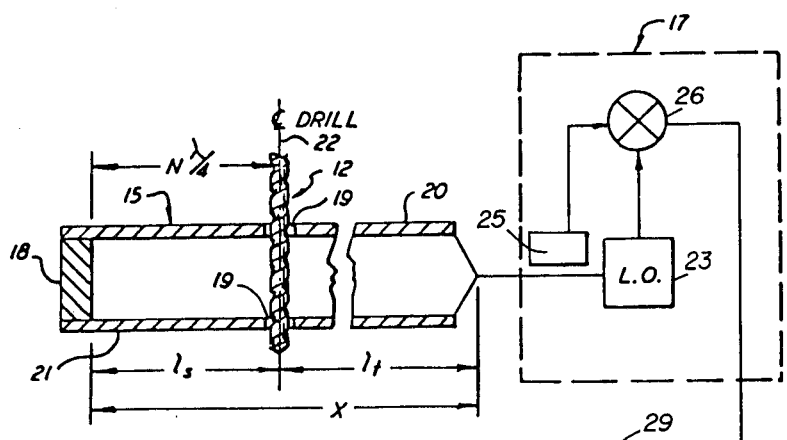
FIG. 2 is a schematic view showing one embodiment of the invention for detecting a target in the form of a drill.

With reference to FIG. 2, transceiver module 17 contains a local oscillator 23, which may be a Gunn diode, that is positioned at one end of the waveguide to propagate a microwave signal down the waveguide toward the target which for illustration is a drill. The adjustable shortening stub is positioned in the waveguide behind the target and is arranged to reflect a well defined return signal back toward the module. The receiver section of the module includes a detector such as a Schottky diode 25 and a mixer circuit 26. The return wave signal is picked up by the diode 25 and is applied to the mixer along with a sample of the transmitted signal. The two input signals are heterodyned down to baseband in the mixer to provide an easily detectable D.C. output signal indicative of the amplitude rather than the frequency of the return signal. The mixer output is coupled directly via line 29 to a comparator 30 through amplifier 31 so that only the D.C. component of the output signal is applied to the comparator.

The microwave system operates on the principle that the presence of a continuous target, such as a fine drill, in or near the end of the waveguide at a predetermined location produces a change in the standing wave ratio (SWR) of the transmitted signal. This change in the SWR is capable of being detected by the receiver to provide a signal that is indicative of the target condition. The comparator threshold can be set to detect either the presence or the absence of a target. Although the present system resembles a doppler radar, it should be apparent that it does not operate on the doppler effect in that the frequency component of the output signal is not utilized in the comparator circuit. As will be explained in greater detail below, the present system is adjusted to provide a clear indication of changes in the amplitude of the D.C. output signal component to determine the presence or absence of a specific target rather than its movement toward or away from the transceiver.

The waveguide dimensions are specifically adjusted for the particular system application to provide for maximum detection sensitivity so long as the width of the waveguide permits transmission. Variations in the height of the waveguide will affect the power level of the transmissions and thus affect the overall sensitivity of the system. The location of the shorting stub is also important. Preferably the stub is located at the N λ/4 or N λ/8 distance from the centerline of the target where λ is the wavelength of the transmitted signal and N is some positive integer. By so positioning the shorting stub, the waveguide is tuned to the transmitted signal to allow detection to be carried out on the linear part of the return signal.

As noted, the local oscillator propagates an electromagnetic wave down the hollow rectangular waveguide which is terminated at the shorting stub. The openings 19 for the tool, which are contained in the broadwalls of the waveguide are minimized to provide sufficient clearance to allow the tool to move axially therein without touching the waveguide. Insertion of a tool into the waveguide causes a change in the magnitude and phase of the reflected wave incident at the transceiver 17. The transceiver heterodynes the signal down to baseband so that the amplitude of the signal D.C. component translates to an easily detectable offset change. The cross-sectional dimensions of the waveguide and the operating frequency of the local oscillator are scaled to any values that are compatible with dominant mode only wave propagation. The system is tolerant in regard to the exact positioning of the tool opening 19 and the stub positioning; however, it is preferred that these locations be optimized for specific applications.

The E-field intensity within the waveguide is shown in FIGS. 3 and 4 for dominant mode propagation. The normal E-field profile across the cross section of the waveguide is shown in FIG. 3 with the maximum strength of the field occurring at central axis 22 of the waveguide and falling off symmetrically to either side thereof. When a tool 12 is positioned in the waveguide, it shorts the E-field at the axis and produces a pronounced change in the profile of the E-field as graphically displayed by the arrows in FIG. 4. By selecting the operating frequency and the waveguide dimensions for dominant mode operation only, the tool acts like a shorting stub to an incident wave and produces a discernible change in the phase and amplitude of the return wave.

Let the total E-field (incident plus reflected waves) at the transceiver be denoted by $V_E$, which can be written:

$$V_E = V_o[(\exp \sigma x) + (\Gamma \exp - \sigma x)]$$

where:
$V_o$ is the incident wave at the load;
$\sigma$ is the complex propagation constant for the waveguide
$\Gamma$ is the complex reflection coefficient of the load
x is the distance from $V_E$ to the load A short section of waveguide can be regarded as being without loss if the tool aperature is sufficiently small.

Therefore $\sigma$ becomes:

$$\sigma = j\beta = j\sqrt{\left[\frac{\omega}{c}\right]^2 - \left[\frac{\pi}{a}\right]^2} \quad (2)$$

where:
$\omega$ is the operating frequency in rad/sec;
c is the speed of light in free space; and
a is the width of the waveguide broadwall.

If the transceiver unit generates a simple sinusoidal signal A exp jωt at the central axis, equations (1) and (2) yield:

$$V_E = A(\exp j\omega t)(\exp - j\beta x)[(\exp j\beta x) + (\Gamma \exp - j\beta x)] \quad (3)$$

The load reflection coefficient is now equal to −1 since either the shorting stub or the tool will present a short circuit to the incident E-field. Equation (3) thus becomes:

$$V_E = 2A(\sin \beta x)[\exp j(\omega t - \beta x + \pi/2)] \quad (4)$$

The transceiver, because it is directly coupled to the comparator, will only detect the D.C. related component of equation (4) which takes the form:

$$V_{Emax} = \delta \cos(\omega t + \phi) \quad (5)$$

where:
$\delta = 2A \sin x$; and
$\phi = \pi/2 - \beta x$
When the tool is removed from the waveguide:

$$x = 1_t + 1_s \quad (6)$$

and when the tool is present in the waveguide:

$$x = 1_t \quad (7)$$

Thus, equations (5)–(7) define the amplitude and the phase at the transceiver for either the presence or the absence of the tool.

With reference to FIG. 2, the present invention will be explained in regard to a simple homodyne transceiver. The baseband mixer D.C. component output of the homodyne transceiver is given by:

$$SO_{D.C.} = \frac{\delta K}{2} \cos(\phi - \theta) \quad (8)$$

where:
$\theta$ is an arbitrary phase constant; and
K is the mixer conversion constant.

Using equations (5) through (8), the following relationship is obtained for the condition where the tool is absent from the waveguide:

$$SO_{D.C.} = KA \sin[\beta(1_t + 1_s)] \cos[\pi/2 - \beta(1_t + 1_s) - \theta] \quad (9)$$

and when the tool is present:

$$SO_{D.C.} = KA \sin(\beta 1_t)[\cos(\pi/2 - \beta 1_t - \theta)] \quad (10)$$

As can be seen, by using either equation (9) or (10) the physical parameters of the target detection system can be easily optimized for any given application so that the output of the comparator can be used to either automatically shut down the machine and/or sound an alarm indicating a discontinuation in the target.

Figure 5:
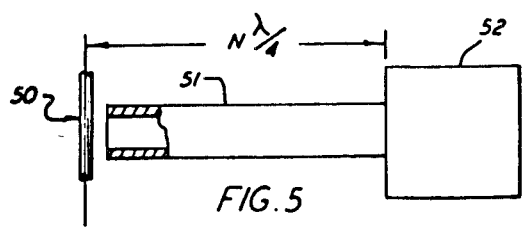
FIG. 5 is another embodiment of the invention showing the target positioned at the end of the waveguide.

Because of certain size constraints, there may be times when the target cannot be passed through the waveguide. In this case, the shorting stub is removed from the waveguide and the distal end of the guide is opened to atmosphere. As illustrated in FIG. 5, the target, which in this case is illustrated by fine wire 50, is positioned at the opening in close proximity with the end face of the waveguide. The target is located a distance N $\lambda/4$ or N $\lambda/8$ times some positive integer from the output of the transceiver. As explained above in greater detail, the parameters of the system can be easily optimized for the $x=1_t$ mode of operation. In this application, the signal sent out by transceiver 52 along the waveguide 51 is somewhat attenuated because of the absence of the shorting stub, however, the return is detectable so that the condition of the target can be ascertained accurately.

Other and further uses and modifications of the microwave detection system of the present invention will be more fully appreciated by those skilled in the art.

What is claimed is:

1. A microwave detection system useful for detecting the presence or absence of a target within a microwave transmission line which comprises a microwave transmission line having an opening within which the target is situated and means for transmitting a microwave signal down the transmission line toward the target and for receiving a reflected return wave signal traveling the opposite direction positioned at one end of the transmission line and forming a transmitter/receiver means connected to said system for transmitting and receiving signals to provide an output signal having a component which indicates the presence or absence of the target within the transmission line opening and processing means coupled directly to the output of the said transmitter/receiver means for comparing the component to a predetermined level to determine the presence or absence of the target, the position of the transmission line opening relative to the transmitter/receiver means is selected to optimize the signal strength from the transmitter/receiver means and is less than the length of the transmission line.

2. The system according to claim 1 wherein the microwave transmission line opening is centered in the line and a shorting stub is positioned in the line behind the target.

3. The system according to claim 1 wherein the transmitter/receiver means is a transceiver.

4. The system according to claim 2 wherein the shorting stub is positioned a distance N $\lambda/4$ or N $\lambda/8$ from the transmission line opening wherein N is any integer and $\lambda$ is the wavelength of the transmitted signal.

5. The system according to claim 3 wherein the transceiver comprises a Gunn diode and a Schottky diode.

6. The system according to claim 1 which further comprises an amplifier operatively positioned between the transmitter/receiver means and the processing means for amplifying the output signal.

7. The system according to claim 1 wherein the transmission line opening is located a distance N $\lambda/4$ or N $\lambda 8$ from the transmitter/receiver means where N is any integer and $\lambda$ is the wavelength of the transmitted signal.

8. The system according to claim 1 wherein the transmission line is a waveguide having an opening centered in the transmission line and a shorting stub is positioned in the waveguide behind the target.

9. The system according to claim 8 wherein the shorting stub is positioned relative to the waveguide opening to optimize the signal strength from the transmitter/receiver means.

10. The system according to claim 9 wherein the waveguide opening is 0.5" or less.

11. A method of detecting the presence or absence of a target within the microwave transmission line of the system of claim 1 which comprises positioning the target within the opening in the transmission line, transmitting a microwave signal down the transmission line toward the target, receiving a return wave signal reflected back along the transmission line in the opposite direction from the target to the transmitter/receiver means to provide an output signal having a component indicative of the presence or absence of the target within the opening, and comparing the component of the signal to a given value to determine the presence or absence of the target, the position of the transmission line opening relative to the transmitter/receiver means is selected to optimize the signal strength from the transmitter/receiver means and is less than the length of the transmission line.

12. The method according to claim 11 which includes the further step of positioning a shorting stub in the line behind the target.

13. The method according to claim 11 wherein the stub is positioned a distance of N $\lambda/4$ or N $\lambda/8$ from the target where N is a positive integer and $\lambda$ is the wavelength of the transmitted signal.

14. The method according to claim 11 wherein the transmission line opening is located a distance N $\lambda/4$ or N $\lambda/8$ from the transmitter/receiver means where N is a positive integer and $\lambda$ is the wavelength of the transmitted signal.

15. A method according to claim 11 which includes the further step of amplifying the transmitter/receiver means signal.

16. A method according to claim 11 wherein the transmission line is a waveguide having an opening centered in the waveguide and a shorting stub is positioned in the waveguide behind the target.

17. The method according to claim 11 wherein the shorting stub is positioned relative to the waveguide opening to optimize the signal strength from the transmitter/receiver means.

* * * * *

REEXAMINATION CERTIFICATE (1430th)
United States Patent [19]
Gelston, II

[11] B1 4,613,812
[45] Certificate Issued Mar. 12, 1991

[54] MICROWAVE DETECTION SYSTEM

[75] Inventor: Norbert E. Gelston, II, Skaneateles, N.Y.

[73] Assignee: U.S. Tech Corporation, Syracuse, N.Y.

Reexamination Request:
No. 90/002,022, May 14, 1990

Reexamination Certificate for:
Patent No.: 4,613,812
Issued: Sep. 23, 1986
Appl. No.: 683,160
Filed: Dec. 18, 1984

Related U.S. Application Data

[63] Continuation-in-part of Ser. No. 579,680, Feb. 13, 1984, abandoned, which is a continuation-in-part of Ser. No. 446,333, Dec. 2, 1982, abandoned.

[51] Int. Cl.$^5$ .................. G01R 27/04; B23B 39/04
[52] U.S. Cl. .................. 324/635; 324/644; 324/632; 340/553; 408/11; 408/6
[58] Field of Search ............ 340/561, 552, 553; 333/248, 253, 263; 324/632, 635, 642, 644, 645

[56] References Cited

U.S. PATENT DOCUMENTS

| | | | |
|---|---|---|---|
| 3,263,166 | 7/1966 | Augustine | 324/644 |
| 3,300,715 | 1/1967 | Tresselt | 324/645 |
| 3,753,086 | 8/1973 | Shoemaker . | |
| 3,870,957 | 3/1975 | Straw . | |
| 3,980,974 | 9/1976 | Yamamoto et al. . | |
| 3,990,805 | 11/1976 | Ducrohet . | |
| 4,045,727 | 8/1977 | Yu . | |
| 4,097,796 | 6/1978 | Lunden . | |
| 4,109,233 | 8/1978 | Erickson | 340/553 |
| 4,118,139 | 10/1978 | Lemelson . | |
| 4,166,973 | 9/1979 | Lilly . | |
| 4,350,883 | 9/1982 | Lagarde | 324/642 |
| 4,403,504 | 7/1983 | Krage | 333/248 |
| 4,437,338 | 3/1984 | Wilson | 324/642 |

FOREIGN PATENT DOCUMENTS

| | | |
|---|---|---|
| 2341948 | 3/1974 | Fed. Rep. of Germany . |
| 52-119586 | 7/1977 | Japan . |
| 445925 | 10/1975 | U.S.S.R. . |

OTHER PUBLICATIONS

"Microwaves as an Industrial Tool"—Measurements & Instruments Review—Feb. 1969, pp. 79–81.
IEEE Transaction on Microwave Theory and Techniques, vol. MIT-32, No. 1, Jan. 1984, pp. 120–122, IEEE, New York; P. I. Somlo: "Radar–Echo Location of Conducting Spheres in Waveguide".
Von Dietrich Homburg, Methods of Monitoring of the Breakage of Tools, 1155 Technische Rundschau, No. 44, p. 25, Nov., 1983.
George L. Ragan, Microwave Transmission Circuits, McGraw-Hill Book Company, Inc., 1948, pp. 484–489.

*Primary Examiner*—Kenneth A. Wieder

[57] ABSTRACT

A microwave detection system is constructed which is useful for detecting the presence or absence of a target within a microwave transmission line.

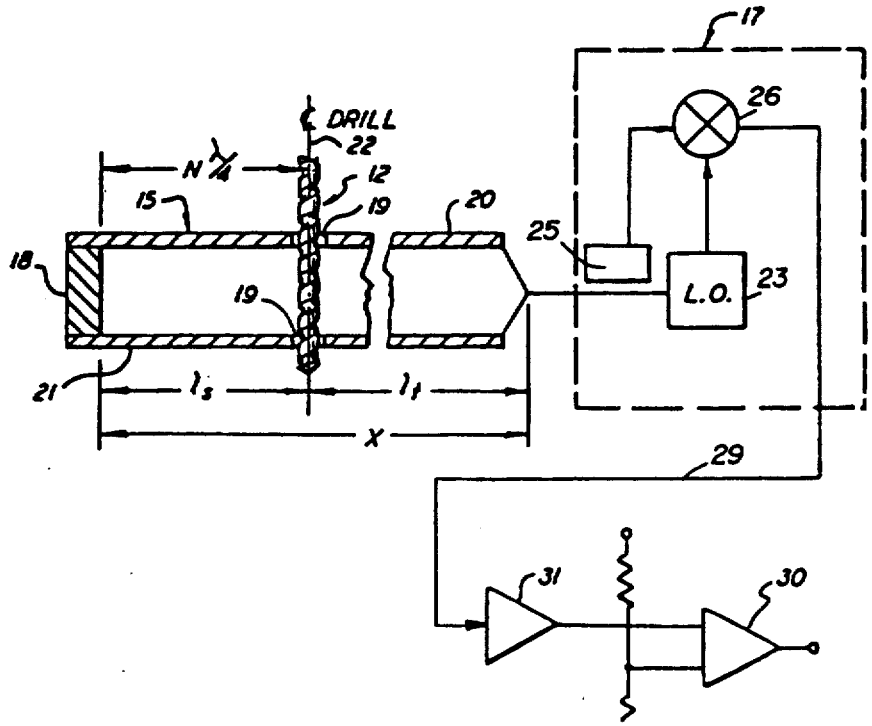

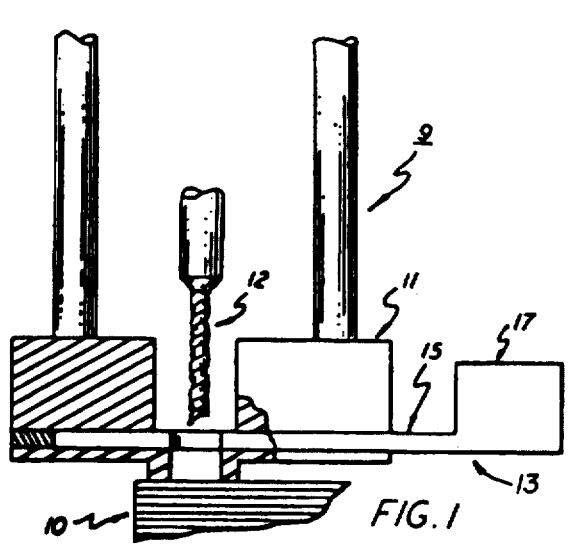
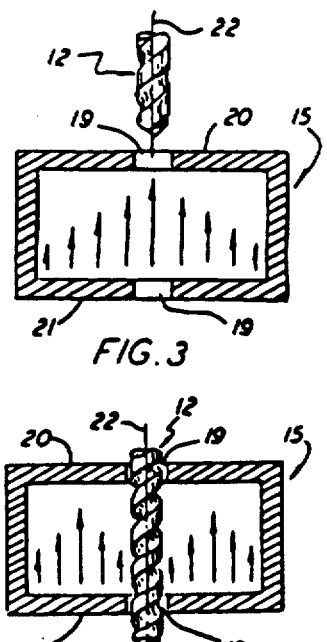
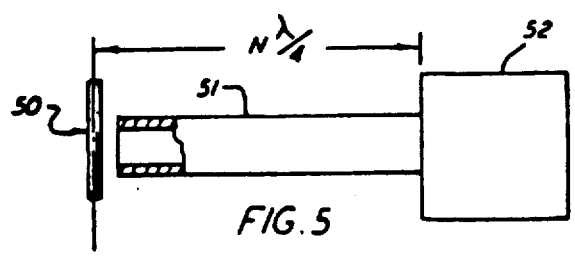
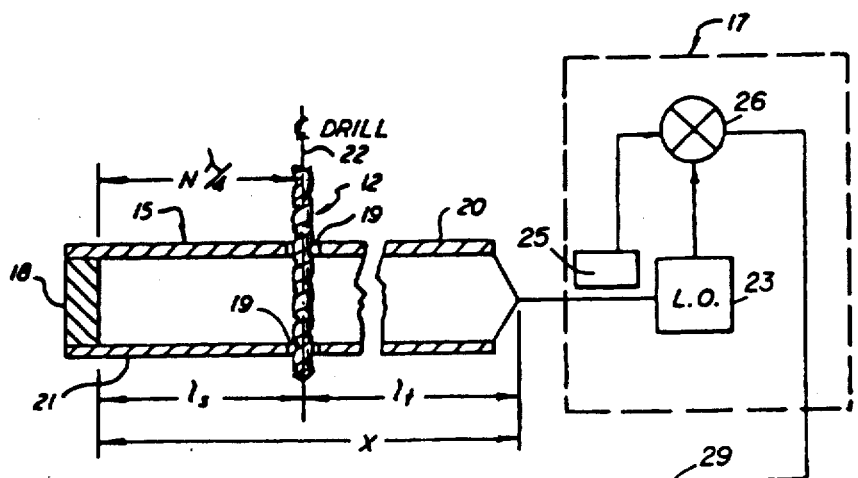
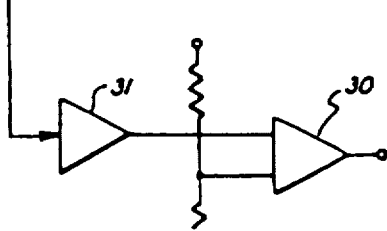

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–17 is confirmed.

* * * * *